(12) United States Patent
Lee

(10) Patent No.: US 7,659,563 B2
(45) Date of Patent: Feb. 9, 2010

(54) COMPLEMENTARY METAL-OXIDE-SILICON (CMOS) IMAGE SENSOR AND METHOD OF FORMING THE SAME

(75) Inventor: Jun-Taek Lee, Hwaseong-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 430 days.

(21) Appl. No.: 11/592,577

(22) Filed: Nov. 4, 2006

(65) Prior Publication Data

US 2007/0114583 A1    May 24, 2007

(30) Foreign Application Priority Data

Nov. 22, 2005   (KR) ............... 10-2005-0111950

(51) Int. Cl.
*H01L 31/062* (2006.01)
*H01L 31/113* (2006.01)

(52) U.S. Cl. ............ 257/292; 257/264; 257/369; 361/56; 361/57

(58) Field of Classification Search ........ 257/292, 257/294, 369, E29.273; 361/56, 57
See application file for complete search history.

(56) References Cited

U.S. PATENT DOCUMENTS

| | | | | |
|---|---|---|---|---|
| 6,407,417 B1 * | 6/2002 | Nagata et al. | ............... | 257/292 |
| 7,358,552 B2 * | 4/2008 | Lee | ............... | 257/292 |
| 7,388,241 B2 * | 6/2008 | Rhodes | ............... | 257/292 |
| 7,442,994 B2 * | 10/2008 | Ha | ............... | 257/347 |
| 2007/0029589 A1 * | 2/2007 | Bahl et al. | ............... | 257/290 |

FOREIGN PATENT DOCUMENTS

| | | |
|---|---|---|
| JP | 2004063624 | 2/2004 |
| KR | 100262006 | 4/2000 |
| KR | 100296142 | 5/2001 |
| KR | 1020040002790 | 1/2004 |
| KR | 1020050082587 | 8/2005 |

OTHER PUBLICATIONS

English Abstract for Publication No. 100262006.
English Abstract for Publication No. 1020000041443 (abstract for 10-0296142).
English Abstract for Publication No. 2004-062624.
English Abstract for Publication No. 10-2005-0082587.
English Abstract for Publication No. 10-2004-0002790.

* cited by examiner

*Primary Examiner*—Phuc T Dang
(74) *Attorney, Agent, or Firm*—F. Chau & Associates, LLC (57) ABSTRACT

A complementary metal-oxide silicon (CMOS) image sensor includes a semiconductor layer of a first conductivity type, a plurality of pixels located in the semiconductor layer, a photoelectric converter located in each of the plurality of pixels in the semiconductor layer and includes a region doped with impurities of a second conductivity type. The CMOS image sensor further includes a deep well of a first conductivity type located in a lower position than the photoelectric converter in the semiconductor layer and has a higher impurity concentration than that of the semiconductor layer. The deep well is located only in a portion of each of the plurality of pixels.

14 Claims, 11 Drawing Sheets

COMPLEMENTARY METAL-OXIDE-SILICON (CMOS) IMAGE SENSOR AND METHOD OF FORMING THE SAME

CROSS-REFERENCE TO RELATED APPLICATION

This application claims priority from Korean Patent Application No. 2005-111950, filed on Nov. 22, 2005, the disclosure of which is hereby incorporated by reference herein in its entirety.

BACKGROUND OF THE INVENTION

1. Technical Field

The present disclosure relates to semiconductor devices, and more particularly CMOS image sensors and to methods of forming the same.

2. Description of the Related Art

An image sensor is a device that typically converts an optical image into an electrical signal. Image sensors are generally categorized as either complementary metal-oxide-silicon (CMOS) image sensors or charge coupled device (CCD) image sensors. Moreover, there are certain benefits in using CMOS as opposed to CCD image sensors and vice versa. For example, CCD image sensors may have beneficial properties with respect to photosensitivity and noise, in comparison to the CMOS image sensors. However, CCD image sensors may have difficulties with respect to high integration and have high power consumption. On the other hand, CMOS image sensors have beneficial properties with respect to high integration and have low power consumption, and CMOS image sensors may also be manufactured relatively simply. The technology of conventional CMOS image sensors will be described below.

For example, a pixel of a CMOS image sensor typically includes photodiodes which receive light and CMOS elements which control image signals input from the photodiodes. Moreover, photodiodes typically include two doped regions doped with impurities of opposite conductivity types. Each of the doped regions included in the photodiodes has the same range of projection (Rp) irrespective of the wavelength of the incident light. An electron-hole pair is generated in the photodiodes, depending upon the wavelength and the intensity of red, green, and blue lights received through a color filter, and an output signal is changed according to the amount of the electrons generated, thereby sensing an image. Also, the conventional CMOS image sensor includes a deep well region under the photodiodes to control a depletion layer region of the photodiodes and thus prevent a leakage current. Additionally, the general deep well region is typically uniformly distributed throughout a pixel region of the conventional CMOS image sensor.

Also, in a conventional CMOS image sensor, the more the wavelength of light increases, the more the penetration depth of the light increases, but the absorption coefficient in a silicon layer also decreases. Consequently, as a result of the above, electron-hole pairs, generated by red and green lights with a long wavelength, may be generated adjacently to the deep well under the photodiode and lights with a long wavelength may also not enter perpendicularly to the CMOS image sensor. Also, electron-hole pairs may be generated under a device isolation layer or a CMOS element (e.g., transistor). Furthermore, the electrons generated adjacently to the deep well or under the device isolation layer or under the transistor may not enter into a photodiode of a corresponding pixel, but rather may instead be diffused into a photodiode of an adjacent pixel. Accordingly, as a result, the sensitivity of the CMOS image sensor may be decreased and cross-talk may occur.

Thus, there is a need for a CMOS image sensor having improved photosensitivity and which is capable of preventing cross-talk and to a method of forming the same.

SUMMARY OF THE INVENTION

The exemplary embodiments of the present invention provide a CMOS image sensor capable of providing improved sensitivity and a method of forming the same.

The exemplary embodiments of the present invention also provide a CMOS image sensor capable of preventing cross-talk and a method of forming the same.

Exemplary embodiments of the present invention provide CMOS image sensors including a deep well located only in a portion of a pixel.

In accordance with an exemplary embodiment of the present invention, a CMOS image sensor is provided. The CMOS image sensor includes a semiconductor layer of a first conductivity type, a plurality of pixels located in the semiconductor layer, a photoelectric converter located in each of the plurality of pixels in the semiconductor layer and includes a region doped with impurities of a second conductivity type. The CMOS image sensor further includes a deep well of a first conductivity type located in a lower position than the photoelectric converter in the semiconductor layer and has a higher impurity concentration than that of the semiconductor layer. The deep well is located only in a portion of each of the plurality of pixels.

In some exemplary embodiments, the semiconductor layer may include a semiconductor substrate of a first conductivity type and an epitaxial layer of a first conductivity type. At this point, an impurity concentration of the epitaxial layer may be lower than that of the semiconductor substrate.

In other exemplary embodiments, the deep well may not overlap the photoelectric converter. The deep well may be located between the photoelectric converters in adjacent pixels and have a mesh shape. A ground unit may be connected to an end of the deep well of the mesh shape. A ground voltage may be applied to the ground unit. The CMOS image sensor may further include a device isolation layer in the semiconductor layer to isolate each of the pixels and a transistor adjacent to the photoelectric converter to transfer electric charges generated in the photoelectric converter. At this point, the deep well may be located under the device isolation layer and the transistor.

In still other exemplary embodiments, the deep well may be not located under the photoelectric converter but rather may be located only under the device isolation layer and the transistor adjacent the photoelectric converter. As the potential of the deep well is higher than that of the semiconductor layer around the deep well, electrons may strongly tend to be located in the semiconductor layer having a relatively lower potential. Therefore, although electrons, by a light entering out perpendicularly to the CMOS image sensor are generated under the device isolation layer adjacent to the photoelectric converter, the electrons may tend to move to the semiconductor layer under the photoelectric converter, but may not to move to the photoelectric converter of an adjacent pixel. Therefore, the sensitivity of the image sensor may be improved and cross-talk may be prevented.

In other exemplary embodiments, the deep well may be located under the photoelectric converter and overlap the photoelectric converter. The CMOS image sensor may further include a deep well connection part connecting the deep well in the pixel with another deep well in an adjacent pixel and is doped with the same impurities at the same concentration as impurities in the deep well. The deep well connection part may have a smaller width than that of the deep well. The CMOS image sensor may further include a ground unit connected to an end of the deep well. A ground voltage may be applied to the ground unit.

In yet other exemplary embodiments, the deep well may be located under the photoelectric converter and not be located under the device isolation layer and the transistor. In this case, as the potential under the device isolation layer and the transistor is lower than that under the photoelectric converter, when electrons are generated under the device isolation layer or under the transistor by a light entering out perpendicularly to the conventional CMOS image sensor, the electrons may strongly tend to remain at the generated position and not move to the photoelectric converter around them. Therefore, cross-talk may be prevented.

In further exemplary embodiments, the CMOS image sensor may further include an interlayer insulating layer covering the semiconductor layer, a planarization layer formed on the interlayer insulating layer, a plurality of color filters located on the planarization layer to produce colors corresponding to each of the pixels; and a plurality of micro lenses formed on the color filters. For example, the first conductivity type may be a p-type and the second conductivity type may be an n-type.

In accordance with an exemplary embodiment of the present invention, a method of forming a complementary metal-oxide-silicon (CMOS) image sensor is provided. The method includes forming a semiconductor layer of a first conductivity type, forming a mask pattern exposing a portion of a region on the semiconductor layer for defining a plurality of pixels in the semiconductor layer, performing an ion implantation process using the mask pattern as an ion implantation mask to form a deep well of a first conductivity type having a higher impurity concentration than that of the semiconductor layer in the semiconductor layer, removing the mask pattern and forming a device isolation layer for isolating the pixels. The method further includes forming a photoelectric converter including a doped region of a second conductivity type in an upper portion of the semiconductor layer located in each of the pixels and forming a transistor adjacent to the photoelectric converter for transferring electric charges generated in the photoelectric converter.

In some exemplary embodiments, the deep well is located only in a portion of each of the plurality of pixels.

In some exemplary embodiments, the deep well may not overlap the photoelectric converter. The mask pattern may have a shape of a plurality of islands isolated from each other and covering a region where the photoelectric converter is formed, and the deep well may have a mesh shape between regions where the photoelectric converter is formed in the semiconductor layer. The deep well may be formed under the device isolation layer and the transistor.

In other exemplary embodiments, the deep well may overlap the photoelectric converter.

In still other exemplary embodiments, the method may further include: forming an interlayer insulating layer covering the photoelectric converter and the transistor; forming the planarization layer on the interlayer insulating layer, forming color filters for producing each of colors corresponding to each of the pixels on the planarization layer, forming a plurality of micro lenses on the color filters and forming a ground contact for applying a ground voltage to the deep well.

BRIEF DESCRIPTION OF THE DRAWINGS

Exemplary embodiments of the present invention can be understood in more detail from the following description taken in conjunction with the accompanying drawings, in which.

DETAILED DESCRIPTION OF THE EXEMPLARY EMBODIMENTS

The present invention will now be described more fully with reference to the accompanying drawings, in which exemplary embodiments of the invention are shown. The invention may, however, be embodied in many different forms and should not be construed as being limited to the exemplary embodiments set forth herein. It will also be understood that when a layer is referred to as being "on" another layer or substrate, it can be directly on the other layer or substrate, or intervening layers may also be present. Like reference numerals in the drawings denote like elements.

Figure 1:
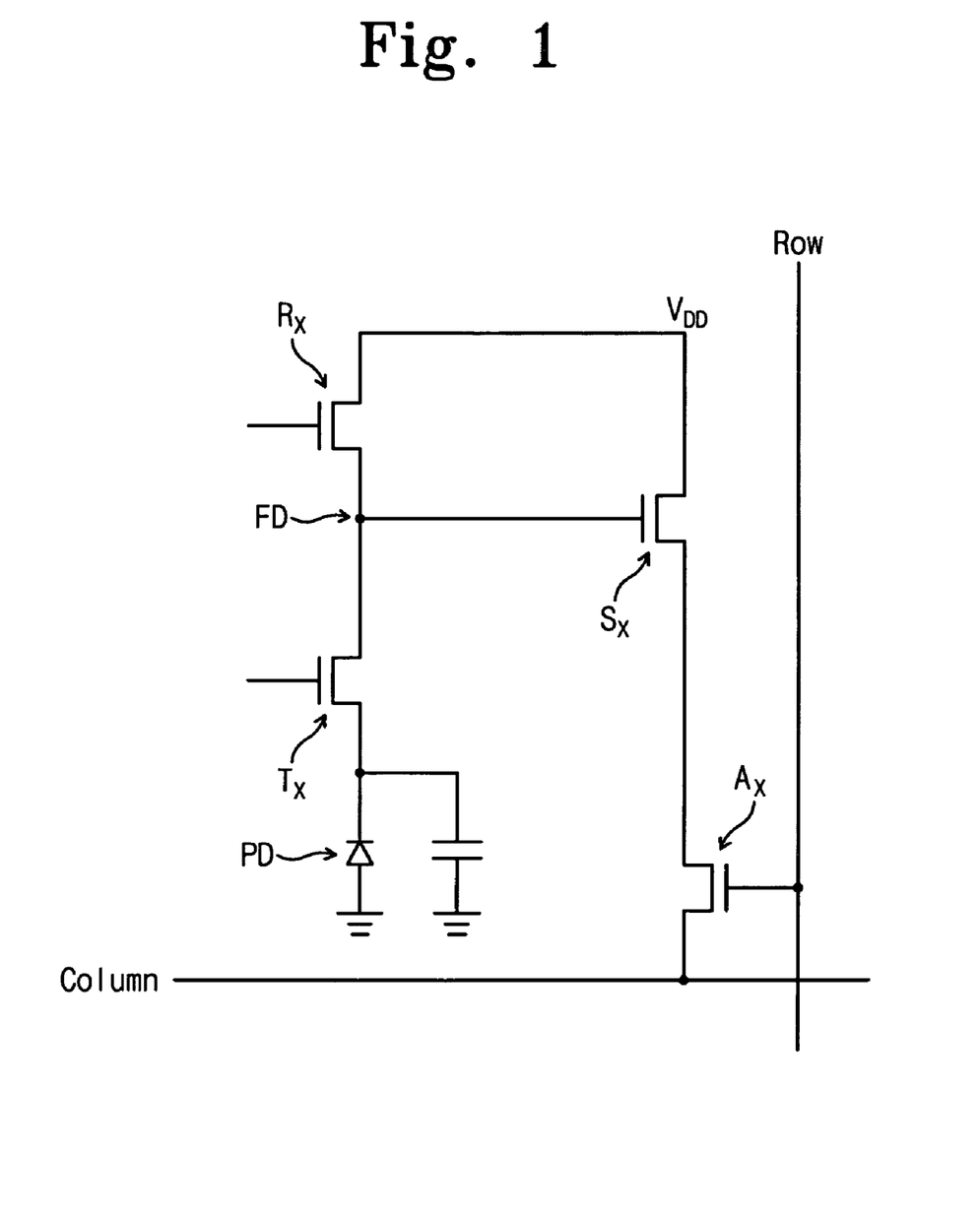
FIG. 1 is an equivalent circuit diagram of a CMOS image sensor according to an exemplary embodiment of the present invention.

FIG. 1 is an equivalent circuit diagram of a CMOS image sensor according to exemplary embodiments of the present invention.

Referring to FIG. 1, in the CMOS image sensor, each of unit pixels insulated by a device isolation layer (Fox) includes a photoelectric converter PD and four transistors Tx, Rx, Sx and Ax. For example, a transfer transistor Tx is located at a side of the relatively large photoelectric converter PD. In addition, a reset transistor Rx, a select transistor Sx, and an access transistor Ax are sequentially located at a side of the transfer transistor Tx. A drain of the transfer transistor Tx and a source of the reset transistor Rx are represented as a floating diffusion region FD.

The operation of the CMOS image sensor of the present exemplary embodiment will now be described with reference to FIG. 1. A power voltage $V_{DD}$ is applied to the reset transistor Rx and the select transistor Sx when light is blocked, and then four transistors or three transistors except the transfer transistor are turned on to detect a reference value. Next, the reset transistor Rx is turned off, and light enters the photoelectric converter PD that is a light-receiving part. An electron-hole pair is generated in the photoelectric converter PD. When the transfer transistor Tx is turned on, the generated electric charges are transferred to the floating diffusion region FD, and a gate bias of the select transistor Sx changes in proportion to an amount of the transferred electric charges. This brings about a potential change in a source of the select transistor Sx. When the access transistor Ax is turned on, a signal is read by the electric charges in a column direction.

Figure 2:
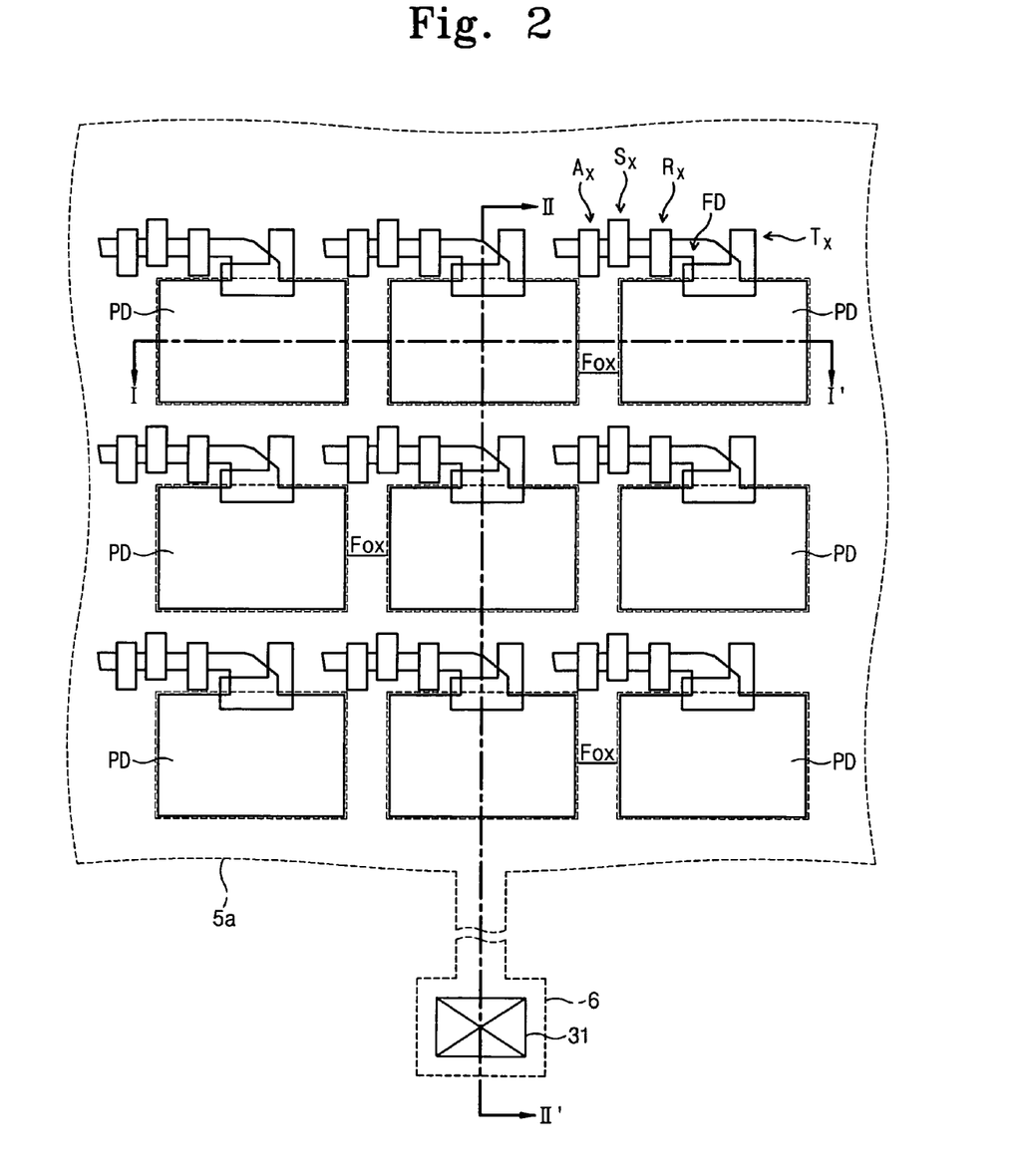
FIG. 2 is a plan view of a CMOS image sensor according to an exemplary embodiment of the present invention.
Figure 3:
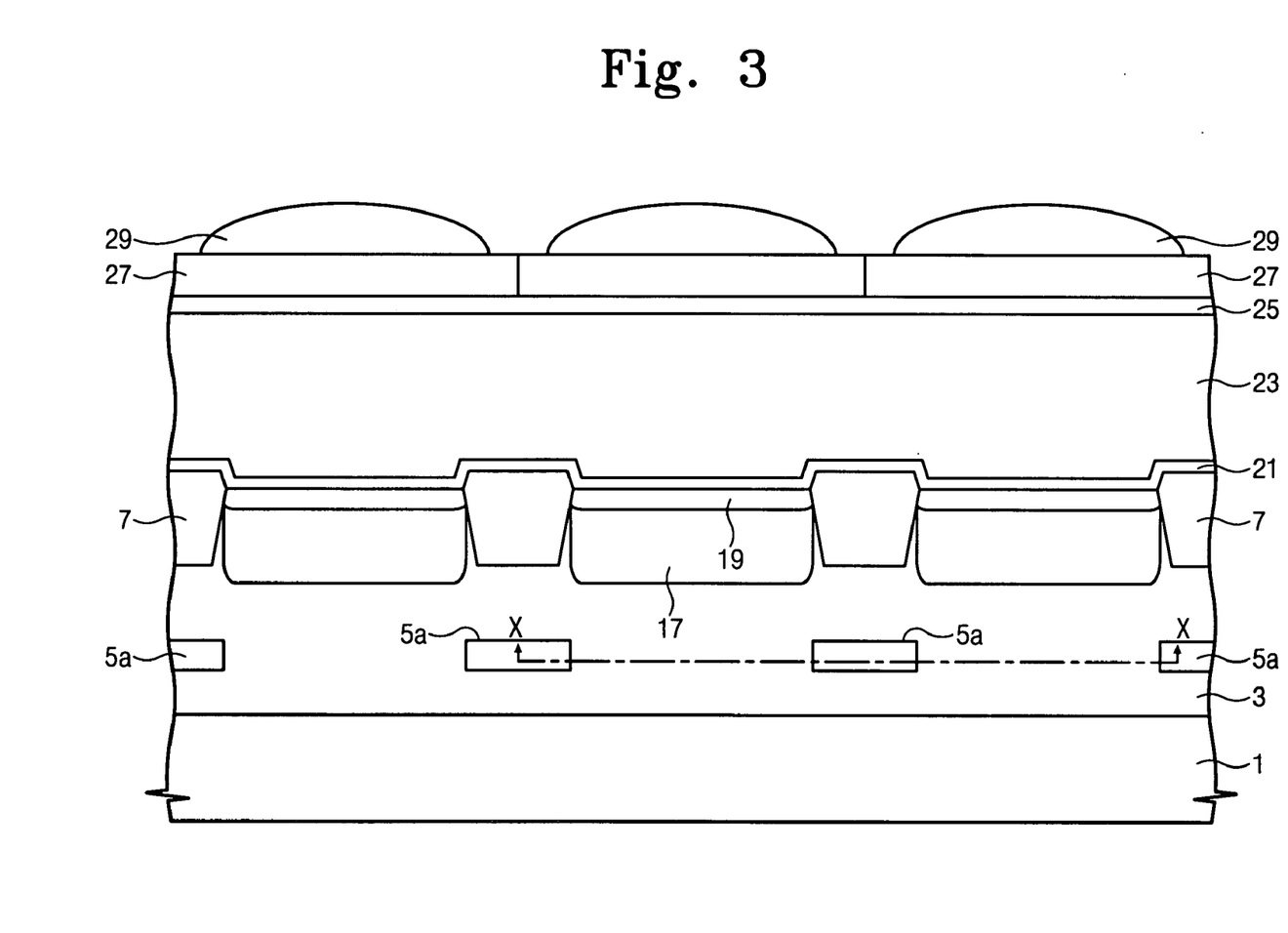
FIG. 3 is a cross-sectional view taken along the line I-I' of the CMOS image sensor of FIG. 2 according to an exemplary embodiment of the present invention.
Figure 5:
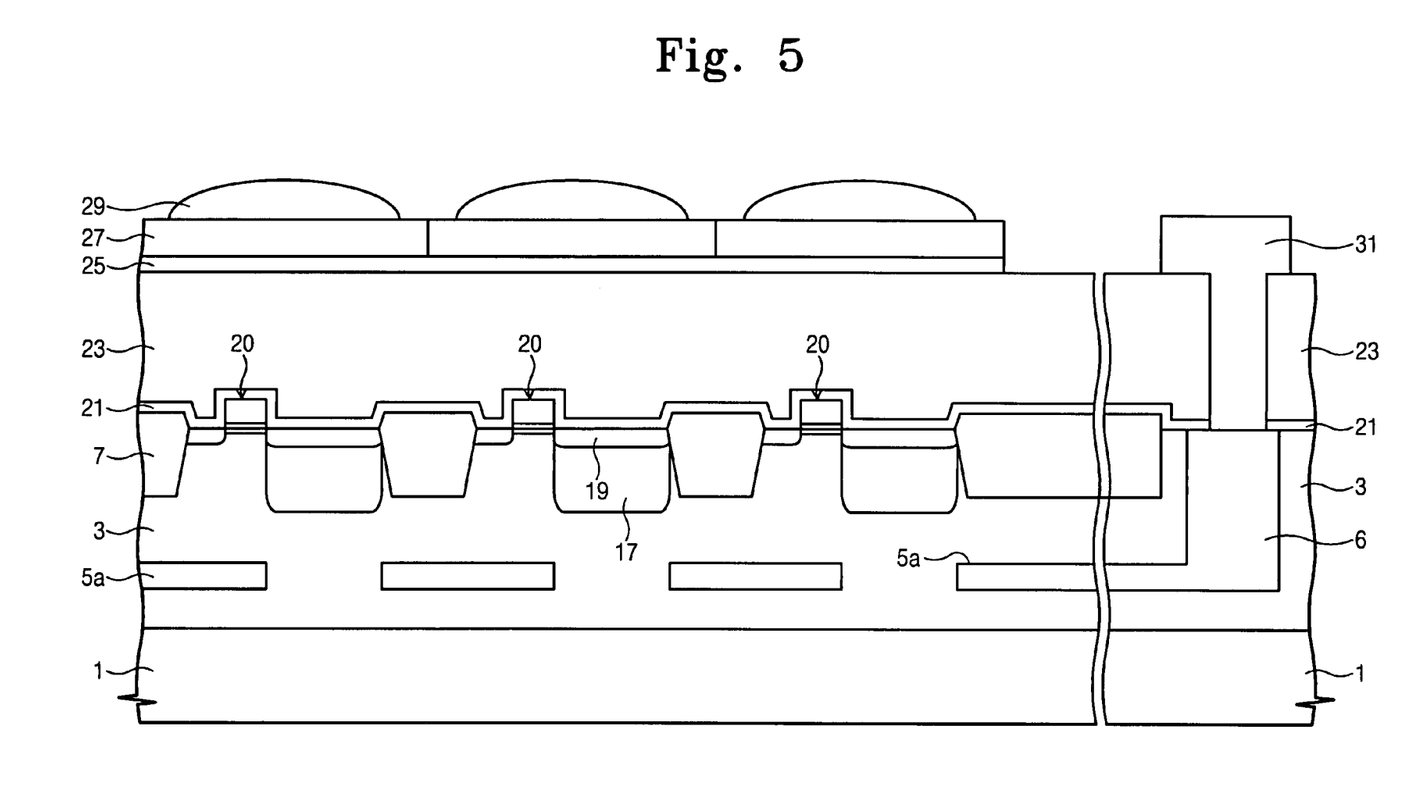
FIG. 5 is a cross-sectional view taken along the line II-II' of the CMOS image sensor of FIG. 2 according to an exemplary embodiment of the present invention.

FIG. 2 is a plan view of a CMOS image sensor according to exemplary embodiments of the present invention. FIG. 3 is a cross-sectional view taken along the line I-I' of FIG. 2. FIG. 5 is a cross-sectional view taken along the line II-II' of FIG. 2.

Referring FIGS. 2, 3 and 5, p-type epitaxial layer 3 is located on a p-type semiconductor substrate 1 including pixel regions for producing their colors. One pixel region means a region where one photoelectrical converter PD and four transistors Tx, Rx, Sx and Ax are formed. The concentration of impurities doped in the semiconductor substrate 1 is higher than that of impurities doped in the epitaxial layer 3. Each of the pixel regions is isolated by a device isolation layer (Fox) 7. A p-type first doped region and an n-type second doped region 17 are located on the epitaxial layer 3 to form a photodiode that is the photoelectric converter PD. The n-type second doped region 17 and the p-type epitaxial layer 3 may also form the photoelectric converter PD. The transfer transistor (Tx) 20 is located adjacently to the photoelectric converter PD on the epitaxial layer 3 to transfer electric charges generated in the photoelectric converter PD. A reflection preventing layer 21, an interlayer insulating layer 23, a planarization layer 25 are sequentially located on the transistors Tx, Rx, Sx and Ax, the photoelectric converter PD, and the device isolation layer 7. The reflection preventing layer 21 may be formed of, for example, a silicon oxide nitride layer (SiON) layer or a silicon nitride ($Si_3N_4$) layer. The interlayer insulating layer 23 may be formed of, for example, a silicon oxide ($SiO_2$) layer or a fluorinated silicon oxide (SiOF) layer. The planarization layer 25 may be formed of, for example, a silicon oxide nitride (SiON) layer or a silicon nitride ($Si_3N_4$) layer. Color filters 27 for producing each color are located on the planarization layer 25. Micro lenses 29 are located on the color filters 27 to condense light.

Next, a p-type deep well 5a is located at a lower position than the photoelectric converter including the second doped region 17 in the epitaxial layer 3. The concentration of impurities doped in the deep well Sa is higher than that of the impurities doped in the epitaxial layer 3. The deep wells 5a are located in a region which does not include the photoelectric converter and has a mesh shape, as illustrated in FIG. 2. The deep well 5a with a mesh shape is located under the transistors Tx, Rx, Sx and Ax and the device isolation layer 7. The deep well 5a is connected to a ground unit 6 receiving a ground voltage, and the ground unit 6 is doped with the same impurities at the same concentration as the impurities of the deep well 5a. The ground unit 6 extends from the deep well 5a to the surface of the epitaxial layer 3. The ground unit 6 is electrically connected to a ground contact 31 penetrating the interlayer insulating layer 23 and the protective layer 21.

Moreover, in the present exemplary embodiment, the deep well 5a may be vertically and uniformly distributed such that the deep well 5a may extend up and down to connect the bottom of the device isolation layer 7 to the semiconductor substrate 1 and the transistors Tx, Rx, Sx and Ax to the semiconductor substrate 1. Alternatively, a channel stop layer doped with p-type impurities of a high concentration may be located under the device isolation layer 7.

Figure 4:
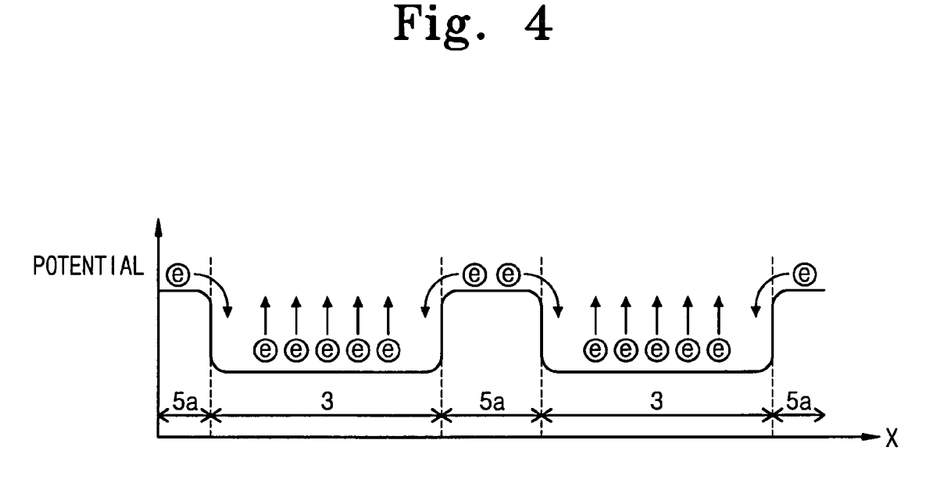
FIG. 4 is a graph illustrating potential distributed along the line X-X of FIG. 3.

FIG. 4 is a graph illustrating potential distributed along the line X-X of FIG. 3.

Referring to FIGS. 3 and 4, with the CMOS image sensor of this exemplary embodiment which includes the deep well 5a formed in a portion of the pixel, as the concentration of the p-type impurities doped in the deep well 5a is higher than that of impurities of the epitaxial layer 3, electrons (e) strongly tend to be located on the epitaxial layer 3. Therefore, electrons generated by light entering the epitaxial layer 3 under the photoelectric converter do not move to the photoelectric converter of the corresponding pixel but rather are diffused into an adjacent pixel due to a high potential barrier of the deep well 5a. Also, electrons generated by light entering out perpendicularly under the device isolation layer 7 strongly tend to move to the photoelectric converter of an adjacent pixel. Also, as the deep well 5a is not located under the photoelectric converter PD, a depletion layer of the photoelectric converter PD can be enlarged substantially. Accordingly, the sensitivity of the CMOS image sensor can be improved.

In addition, a ground voltage is applied to the deep well 5a. Therefore, electrons and holes can be unlimitedly provided to the deep well 5a. Also, electrons formed around the deep well 5a which move to an adjacent pixel can be recombined with holes in the deep well 5a. Accordingly, cross-talk by the inflow of electrons can be prevented between adjacent pixels. Also, the CMOS image sensor can be stably operated.

Figure 6:
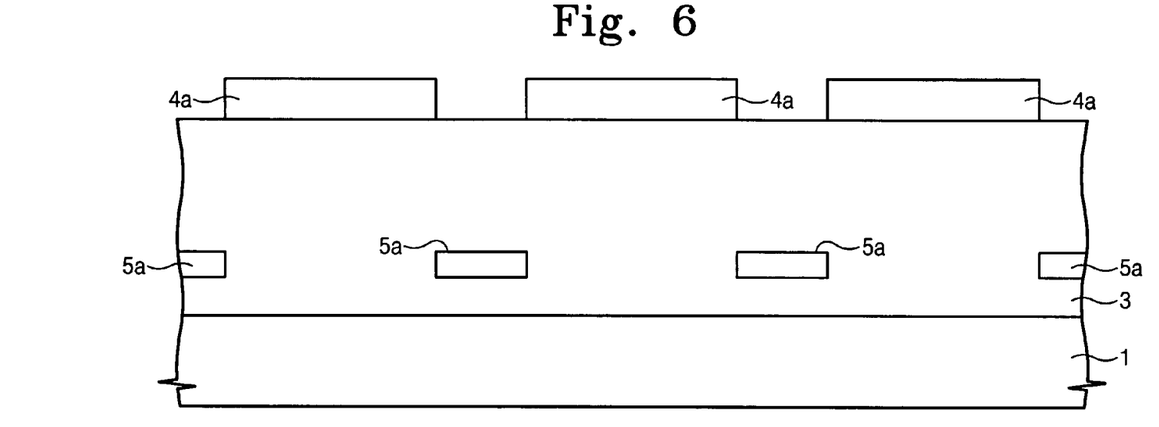
FIGS. 6 and 7 are views for sequentially illustrating a method of forming the CMOS image sensor of FIG. 3.
Figure 7:
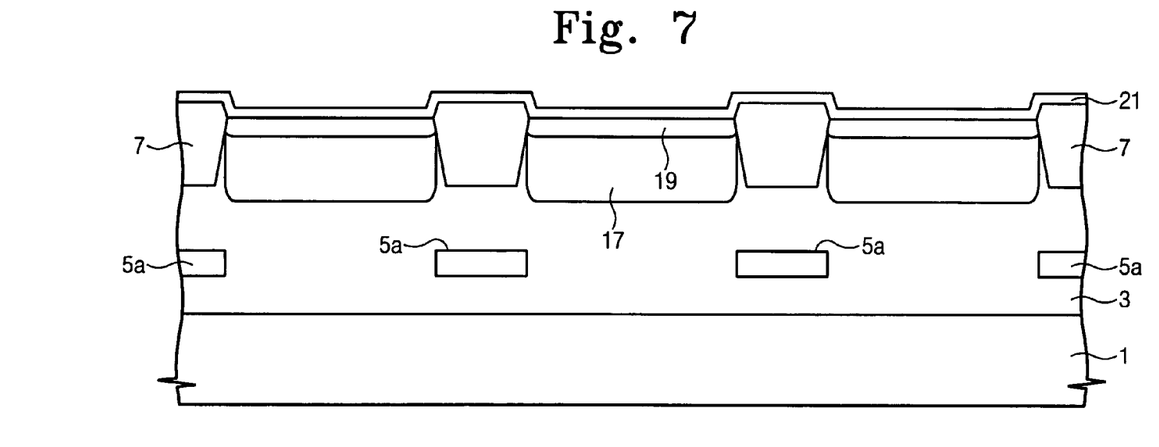

FIGS. 6 and 7 are views for illustrating a method of forming the CMOS image sensor of FIG. 3.

Referring to FIG. 6, an epitaxial layer 3 is grown on a semiconductor substrate 1 doped with p-type impurities. The epitaxial layer 3 may be grown while being doped with p-type impurities. A mask pattern 4a is formed on the epitaxial layer 3. The mask pattern 4a may be a photoresist pattern or a hard mask pattern that is formed of, for example, a silicon nitride layer or a silicon oxide layer. The mask pattern 4a has the shape of a plurality of islands isolated from each other and cover a region where the photoelectric converter PD of FIG. 2 is formed to define the shape of the deep well. In addition, the mask pattern 4a may also have a shape for defining the ground unit 6 of FIG. 2. A deep well 5a is formed in the epitaxial layer 3 using the mask pattern 4a as an ion implantation mask. The deep well 5a may be formed, for example, by implanting boron at a dose of about $1 \times 10^{11}$~ about $1 \times 10^{12}$ atoms/$cm^2$. Therefore, the deep well 5a is formed in a mesh shape. Also, the ground unit 6 may be formed while or after forming the deep well 5a.

Referring to FIG. 7, a device isolation layer 7 is formed on the epitaxial layer 3 to isolate each pixel. The device isolation layer 7 may be formed, for example, by a general shallow trench isolation process. The mask pattern 4a may be used as a mask for forming the device isolation layer 7. Alternatively, the mask pattern 4a may be removed before forming the device isolation layer 7. Ions are implanted into each of the pixels to form second and first doped regions 17 and 19, thereby forming a photoelectric converter PD. For example, the second doped region 17 may be formed by implanting arsenic at a dose of approximately $1 \times 10^{12}$ atoms/$cm^2$, and the first doped region 19 may be formed by implanting boron difluoride ($BF_2$) at a dose of approximately $1 \times 10^{13}$ atoms/$cm^2$. In the present exemplary embodiment, the transistors Tx, Rx, Sx and Ax for transferring electric charges illustrated in FIG. 2 are formed after forming the photoelectric converter PD. Also, a protective layer 21 is conformally formed on the entire upper surface of the semiconductor substrate 1.

Next, an interlayer insulating layer 23, a planarization layer 25, color filters 27, and micro lenses 29 are formed to complete the CMOS image sensor of FIG. 3. Also, the interlayer insulating layer 23 is patterned to form a contact hole exposing the ground unit 6, and then the contact hole is filled with a conductive material to form the ground contact 31 of FIG. 5.

Figure 8:
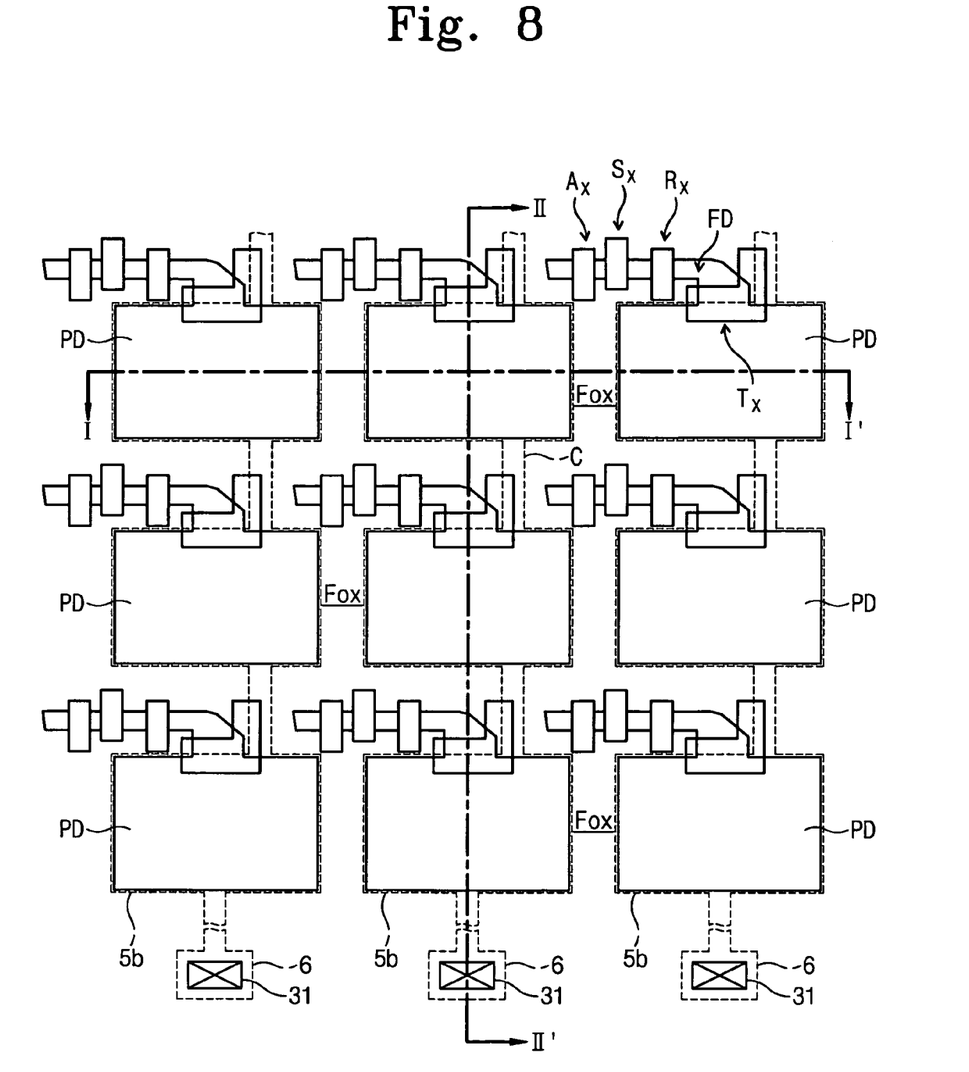
FIG. 8 is a plan view of a CMOS image sensor according to an exemplary embodiment of the present invention.
Figure 9:
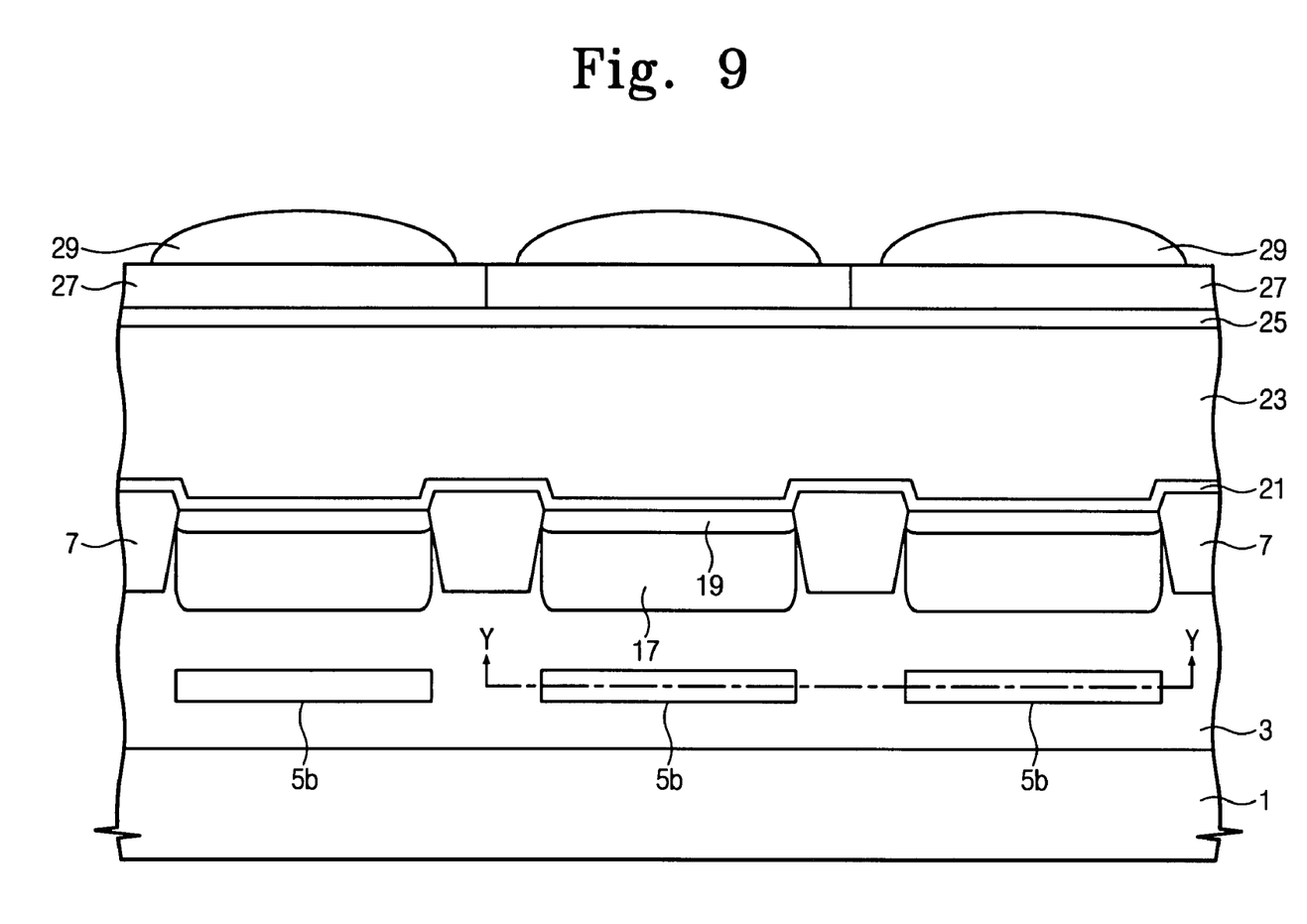
FIG. 9 is a cross-sectional view taken along the line I-I' of the CMOS image sensor of FIG. 8 according to an exemplary embodiment of the present invention.
Figure 11:
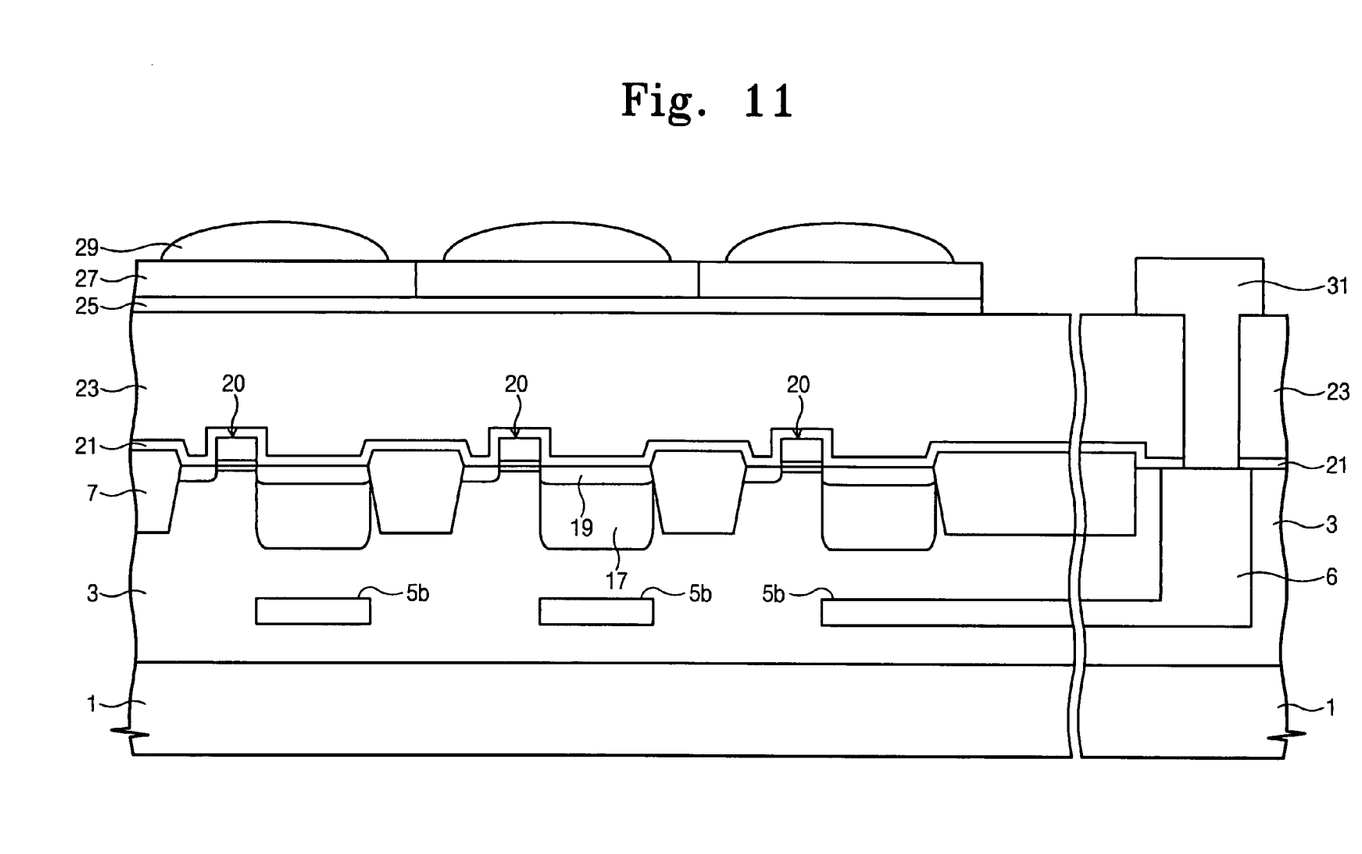
FIG. 11 is a cross-sectional view taken along the line II-II' of the CMOS image sensor of FIG. 8 according to an exemplary embodiment of the present invention.

FIG. 8 is a plan view of a CMOS image sensor according to another exemplary embodiment of the present invention. FIG. 9 is a cross-sectional view taken along the line I-I' of FIG. 8. FIG. 11 is a cross-sectional view taken along the line II-II' of FIG. 8.

Referring to FIGS. 8, 9 and 11, contrary to the first exemplary embodiment, a deep well 5b almost overlaps a photoelectric converter PD. That is, the deep well 5b is located under the photoelectric converter PD in an epitaxial layer 3. Meanwhile, the deep well 5b is connected to an adjacent deep well 5b by a connection part C. The connection part C is doped with the same impurities at the same concentration as impurities of the deep well 5b, and has a much smaller width than the width of the deep well 5b. The connection part C has, for example, the smallest line width sufficient for applying a ground voltage to the deep well 5b such that cross-talk does not occur between adjacent pixels. FIG. 8 illustrates that the deep wells 5b are connected to each other along the line II-II'. However, the deep wells 5b may be connected in various configurations. The deep well 5b is connected to a ground unit 6, and a ground voltage is applied by a ground contact 31. As the connection parts C connects the deep wells 5b, the ground contact 31 does not need to be formed in each of the pixels, and may be formed at a certain position. This is beneficial to the high integration of the CMOS image sensor. Other structures for the present exemplary embodiment are identical with the structures of the first embodiment.

Figure 10:
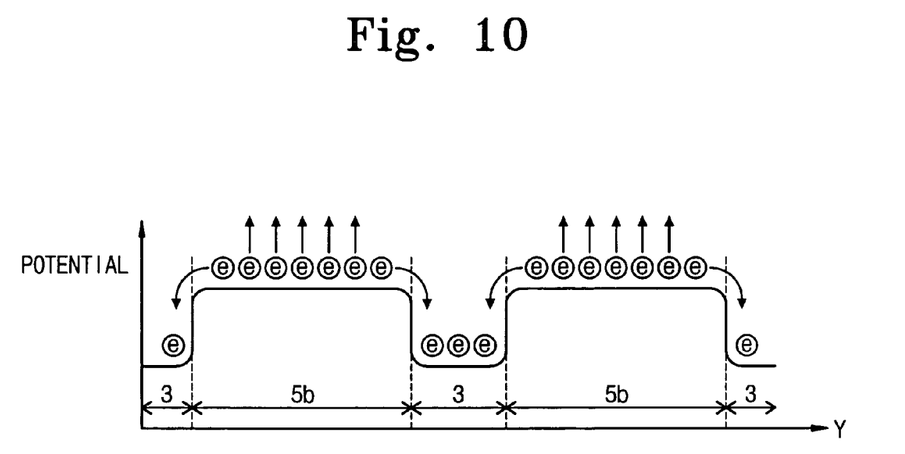
FIG. 10 is a graph illustrating potential distributed along the line Y-Y of FIG. 9.

FIG. 10 is a graph illustrating potential distributed along the line Y-Y of FIG. 9. Referring to FIGS. 9 and 10, as the concentration of p-type impurities doped in the deep well 5b is higher than that of impurities in the epitaxial layer 3, electrons (strongly tend to be located in the epitaxial layer 3. Therefore, electrons generated by light entering the epitaxial layer 3 under the device isolation layer 7 are not diffused into the photoelectric converter in an adjacent pixel and strongly tend to remain in the epitaxial layer 3 with a low potential. Accordingly, cross-talk between pixels can be prevented.

Figure 12:
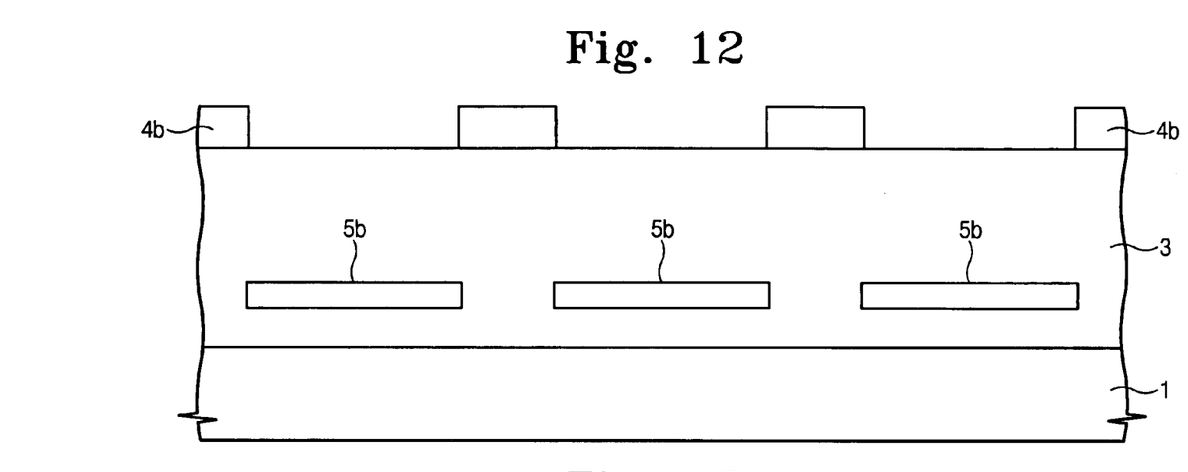
FIGS. 12 and 13 are views for sequentially illustrating a method of forming the CMOS image sensor of FIG. 9.
Figure 13:
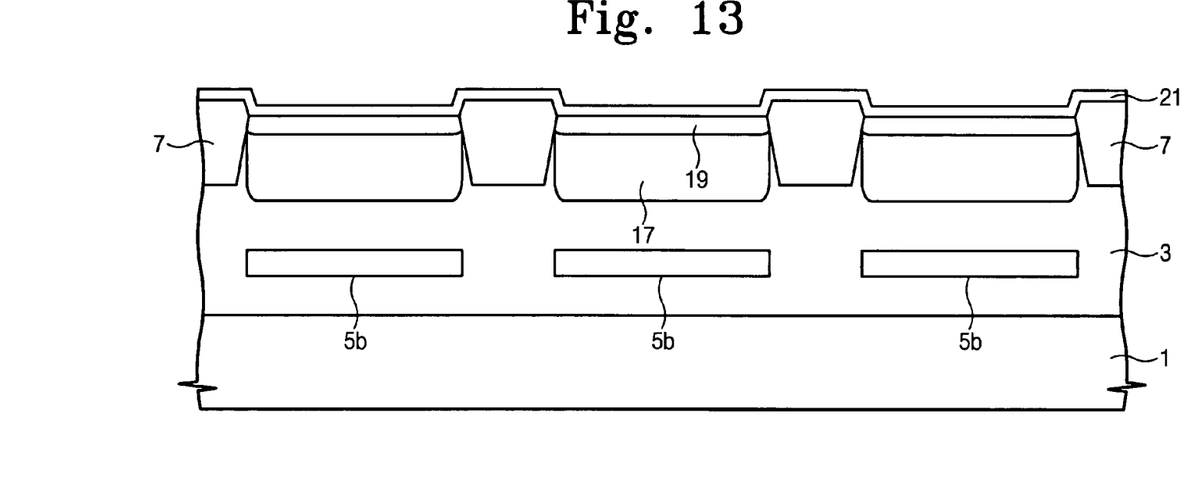

FIGS. 12 and 13 are views for illustrating a method of forming the CMOS image sensor of FIG. 9.

Referring to FIG. 12, an epitaxial layer 3 is grown on a semiconductor substrate doped with p-type impurities. The epitaxial layer 3 may be grown while being doped with p-type impurities. A mask pattern 4b is formed on the epitaxial layer 3. The mask pattern 4b covers a region except for the photoelectric converter PD, the connection part C, and the ground unit 6 of FIG. 8. A deep well 5b is formed in the epitaxial layer 3 using the mask pattern 4b as an ion implantation mask. The deep well 5b may be formed, for example, by implanting boron at a dose of about $1 \times 10^{11}$ ~ about $1 \times 10^{12}$ atoms/cm$^2$. Therefore, the deep well 5b is formed in the shape illustrated in FIG. 8.

Referring to FIG. 13, the mask pattern 4b is removed. A device isolation layer 7 is formed on the epitaxial layer 3 to isolate each pixel. The device isolation layer 7 may be formed, for example, by a general shallow trench isolation process. Ions are implanted into each of the pixels to form second and first doped regions 17 and 19, thereby forming a photoelectric converter PD. The transistors Tx, Rx, Sx and Ax for transferring electric charges illustrated in FIG. 8 are formed after forming the photoelectric converter PD. Also, a protective layer 21 is conformally formed on an entire upper surface of the semiconductor substrate 1. Next, an interlayer insulating layer 23, a planarization layer 25, color filters 27, and micro lenses 29 are formed to finish the CMOS image sensor of FIG. 9. Also, the interlayer insulating layer 23 is patterned to form a contact hole exposing the ground unit 6, and then the contact hole is filled with a conductive material to form the ground contact 31 of FIG. 11.

According to the CMOS image sensor of some exemplary embodiments of the present invention, the deep well is located under the photoelectric converter and overlaps only the photoelectric converter. In other exemplary embodiments, the deep well does not overlap the photoelectric converter but rather is formed under a device isolation layer and a transistor adjacent to the photoelectric converter. The exemplary embodiments of the present invention, thereby improve photosensitivity and prevent cross-talk.

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. A complementary metal-oxide-silicon (CMOS) image sensor comprising:
   a semiconductor layer of a first conductivity type;
   a plurality of pixels located in the semiconductor layer;
   a plurality of photoelectric converters located in each of the plurality of pixels in the semiconductor layer and including regions doped with impurities of a second conductivity type; and
   a plurality of deep wells of the first conductivity type located in a lower position than the plurality of the photoelectric converters in the semiconductor layer and having a higher impurity concentration than that of the semiconductor layer,
   wherein the deep wells are surrounded by the semiconductor layer and are separated from a surface of the semiconductor layer.

2. The CMOS image sensor of claim 1, wherein the deep wells are apart from each other and almost overlap the photoelectric converters.

3. The CMOS image sensor of claim 2, further comprising a ground unit connected to the deep wells to receive a ground voltage applied thereto.

4. The CMOS image sensor of claim 1, further comprising:
   a plurality of device isolation layers in the semiconductor layer to isolate each of the pixels; and
   a plurality of transistors adjacent to the photoelectric converters to transfer electric charges generated in the photoelectric converters,
   wherein the deep wells are apart from each other and almost overlap the device isolation layers and the transistors.

5. The CMOS image sensor of claim 4, further comprising:
   a ground unit connected to the deep wells to receive a ground voltage applied thereto.

6. The CMOS image sensor of claim 5, further comprising:
   a deep well connection part connecting the deep wells and doped with the same impurities at the same concentration as that of the deep well, wherein the deep well connection part has a smaller width than that of the deep well.

7. The CMOS image sensor of claim 1, further comprising:
   an inter-layer insulating layer covering the semiconductor layer;
   a planarization layer on the interlayer insulating layer;

a plurality of color filters on the planarization layer to produce colors corresponding to each of the pixels; and a plurality of micro lenses on the color filters.

8. The CMOS image sensor of claim 1, wherein the first conductivity type is a p-type and the second conductivity type is an n-type.

9. A complementary metal-oxide-silicon (CMOS) image sensor comprising:

a semiconductor layer of a first conductivity type;

a plurality of pixels located in the semiconductor layer;

a plurality of photoelectric converters located in each of the plurality of pixels in the semiconductor layer and including regions doped with impurities of a second conductivity type;

a plurality of deep wells of the first conductivity type located in a lower position than the plurality of the photoelectric converters in the semiconductor layer and having a higher impurity concentration than that of the semiconductor layer; and a ground unit connected to the deep wells to receive a ground voltage applied thereto, wherein the deep wells are surrounded by the semiconductor layer and are separated from a surface of the semiconductor layer.

10. The CMOS image sensor of claim 9, further comprising:

a plurality of device isolation layers in the semiconductor layer to isolate each of the pixels; and a plurality of transistors adjacent to the photoelectric converters to transfer electric charges generated in the photoelectric converters, wherein the deep wells are apart from each other and almost overlap the device isolation layers and the transistors.

11. A complementary metal-oxide-silicon (CMOS) image sensor comprising:

a semiconductor layer of a first conductivity type;

a plurality of pixels located in the semiconductor layer;

a plurality of photoelectric converters located in each of the plurality of pixels in the semiconductor layer and including regions doped with impurities of a second conductivity type;

a plurality of deep wells of the first conductivity type located in a lower position than the plurality of the photoelectric converters in the semiconductor layer and having a higher impurity concentration than that of the semiconductor layer;

a deep well connection part connecting the deep wells and doped with the same impurities at the same concentration as that of the deep well, wherein the deep wells are apart from each other and almost overlap the photoelectric converters respectively, and the deep well connection part has a smaller width than that of the deep well.

12. The CMOS image sensor of claim 11, further comprising a ground unit connection to the deep wells.

13. The CMOS image sensor of claim 11, further comprising:

an inter-layer insulating layer covering the semiconductor layer;

a planarization layer on the interlayer insulating layer;

a plurality of color filters on the planarization layer to produce colors corresponding to each of the pixels; and a plurality of micro lenses on the color filters.

14. The CMOS image sensor of claim 11, wherein the first conductivity type is a p-type and the second conductivity type is an n-type.

* * * * *